(12) United States Patent
Lee

(10) Patent No.: US 10,587,252 B2
(45) Date of Patent: Mar. 10, 2020

(54) SKEW COMPENSATION CIRCUIT

(71) Applicant: Shanghai Zhaoxin Semiconductor Co., Ltd., Shanghai (CN)

(72) Inventor: Yeong-Sheng Lee, Fremont, CA (US)

(73) Assignee: SHANGHAI ZHAOXIN SEMICONDUCTOR CO., LTD., Shanghai (CN)

(*) Notice: Subject to any disclaimer, the term of this patent is extended or adjusted under 35 U.S.C. 154(b) by 110 days.

(21) Appl. No.: 16/044,787

(22) Filed: Jul. 25, 2018

(65) Prior Publication Data
US 2020/0036369 A1 Jan. 30, 2020

(51) Int. Cl.
*G06F 1/10* (2006.01)
*H03K 5/151* (2006.01)

(52) U.S. Cl.
CPC .............. *H03K 5/151* (2013.01); *G06F 1/10* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,429,439 B2 * | 4/2013 | Asmanis | ........... | H04L 25/03878 327/161 |
| 2005/0114724 A1 * | 5/2005 | Wu | .......... | G06F 1/10 713/401 |
| 2009/0096500 A1 * | 4/2009 | Seo | .......... | H03K 5/12 327/170 |
| 2009/0174448 A1 * | 7/2009 | Zabinski | ......... | H03L 7/00 327/161 |
| 2019/0158090 A1 * | 5/2019 | Seo | .......... | H03K 19/00323 |

FOREIGN PATENT DOCUMENTS

CN 107846207 A 3/2018

* cited by examiner

*Primary Examiner* — Raymond N Phan
(74) *Attorney, Agent, or Firm* — McClure, Qualey & Rodack, LLP

(57) ABSTRACT

A skew compensation circuit includes a common mode generator, a common mode comparator, a common mode detector, and a skew adjustment circuit. The common mode generator generates a common mode voltage according to a first input voltage and a second input voltage. The common mode comparator generates a first comparison voltage and a second comparison voltage according to the common mode voltage. The common mode detector generates a first control voltage, a second control voltage, a third control voltage, and a fourth control voltage according to the first comparison voltage, the second comparison voltage, a first data voltage, and a second data voltage. The skew adjustment circuit generates a first output voltage and a second output voltage according to the first data voltage, the second data voltage, the first control voltage, the second control voltage, the third control voltage, and the fourth control voltage.

13 Claims, 9 Drawing Sheets

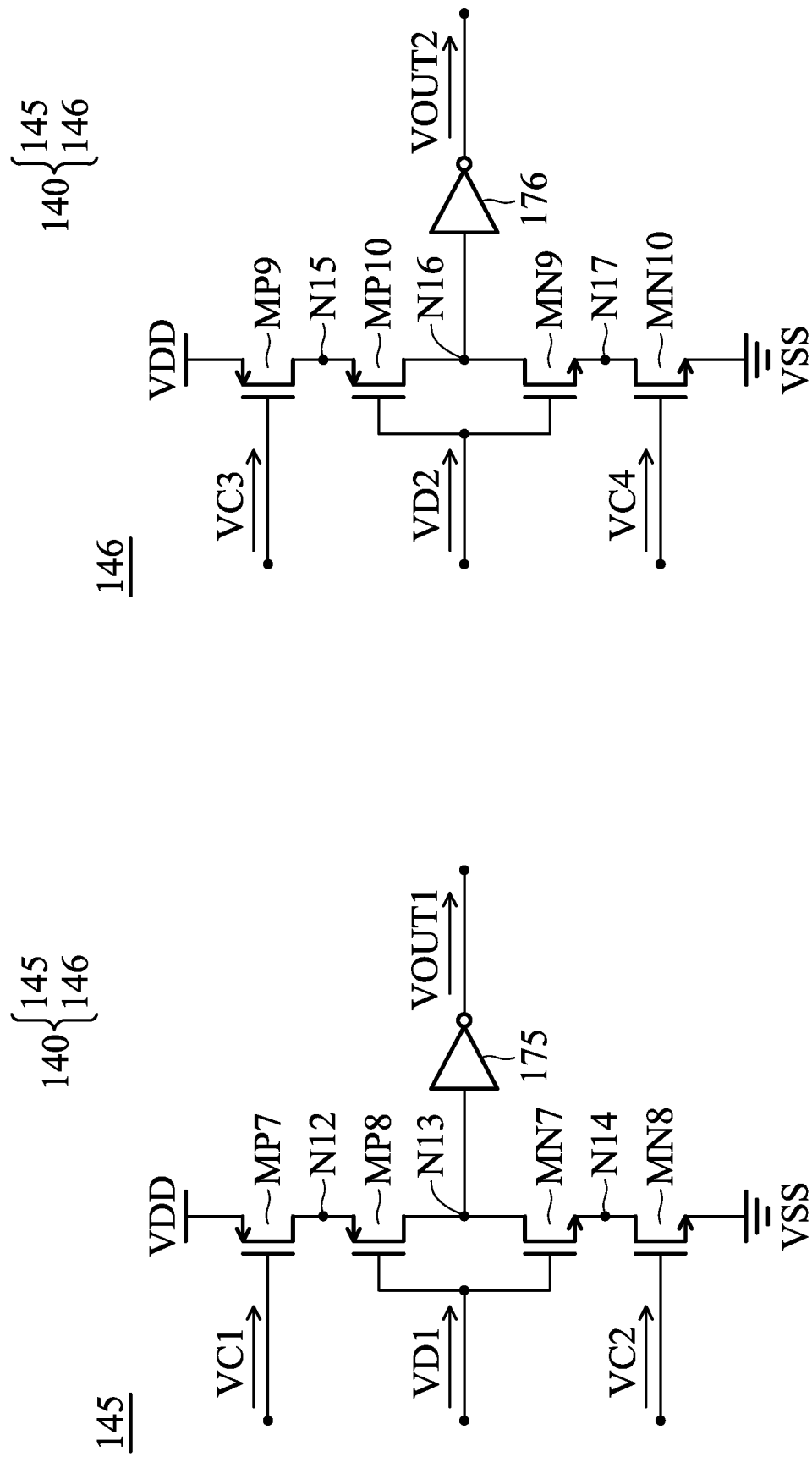

SKEW COMPENSATION CIRCUIT

BACKGROUND OF THE INVENTION

Field of the Invention

The disclosure generally relates to a skew compensation circuit, and more specifically, to a skew compensation circuit for reducing intra-pair skew in circuitry.

Description of the Related Art

For a high-speed communication system, the design of PCB (Printed Circuit Board) is very critical. When differential signals are transmitted through the PCB, the difference between the lengths of positive and negative traces on the PCB causes intra-pair skew. The intra-pair skew further results in EMI (Electromagnetic Disturbance) and too small an eye-diagram, thereby degrading the performance of circuitry. Accordingly, there is a need to propose a novel solution for solving the problems of the prior art.

BRIEF SUMMARY OF THE INVENTION

In a preferred embodiment, the invention is directed to a skew compensation circuit used for a transmitter, the transmitter generating a pair of transmitter output signals according to a first data voltage and a second data voltage, the skew compensation circuit comprising: a common mode generator, receiving a first input voltage and a second input voltage, wherein the first input voltage and the second input voltage are generated from the pair of transmitter output signals of the transmitter, wherein the common mode generator generates a common mode voltage according to the first input voltage and the second input voltage; a common mode comparator, generating a first comparison voltage and a second comparison voltage by comparing the common mode voltage with a first reference voltage and a second reference voltage, respectively; a common mode detector, generating a first control voltage, a second control voltage, a third control voltage, and a fourth control voltage according to the first comparison voltage, the second comparison voltage, the first data voltage, and the second data voltage; and a skew adjustment circuit, generating a first output voltage by delaying the first data voltage by a first tunable delay time determined by the first control voltage and the second control voltage, and generating a second output voltage by delaying the second data voltage by a second tunable delay time determined by the third control voltage and the fourth control voltage, wherein the first output voltage and the second output voltage are arranged for controlling the transmitter to generate the pair of transmitter output signals.

In some embodiments, the first input voltage and the second input voltage are respectively received through a first trace and a second trace on a PCB (Printed Circuit Board) from output nodes of the transmitter, and wherein the first output voltage and the second output voltage are output to input nodes of the transmitter.

In some embodiments, the common mode generator comprises: a first resistor, coupled between a first far node and a common mode node, wherein the first far node is arranged for receiving the first input voltage, and the common mode node is arranged for outputting the common mode voltage; and a second resistor, coupled between the common mode node and a second far node, wherein the second far node is arranged for receiving the second input voltage.

In some embodiments, the common mode comparator comprises: a third resistor, coupled between a supply voltage and a first node; a fourth resistor, coupled between the first node and a second node; a fifth resistor, coupled between the second node and a third node; a sixth resistor, coupled between the third node and a ground voltage; a first comparator, wherein the first comparator has a positive input terminal for receiving the common mode voltage, a negative input terminal coupled to the first node, and an output terminal for outputting the first comparison voltage; and a second comparator, wherein the second comparator has a negative input terminal for receiving the common mode voltage, a positive input terminal coupled to the third node, and an output terminal for outputting the second comparison voltage.

In some embodiments, the common mode comparator further comprises: an operational amplifier, wherein the operational amplifier has a positive input terminal coupled to the second node, a negative input terminal, and an output terminal fed back to the negative input terminal.

In some embodiments, the common mode detector generates the first control voltage according to the first comparison voltage and the first data voltage, generates the second control voltage according to the second comparison voltage and the second data voltage, generates the third control voltage according to the first comparison voltage and the second data voltage, and generates the fourth control voltage according to the second comparison voltage and the first data voltage.

In some embodiments, the common mode detector comprises a first circuit which comprises: a first AND gate, wherein the first AND gate has a first input terminal for receiving the first data voltage, a second input terminal for receiving the first comparison voltage, and an output terminal for outputting a first tuning voltage; a first inverter, wherein the first inverter has an input terminal for receiving the first tuning voltage, and an output terminal for outputting an inverted first tuning voltage; a first switch element, coupled between a supply voltage and a fourth node, wherein the first switch element is closed or opened according to the first tuning voltage; a second switch element, coupled between the fourth node and a ground voltage, wherein the second switch element is closed or opened according to the inverted first tuning voltage; a first N-type transistor, wherein the first N-type transistor has a control terminal coupled to the fourth node, a first terminal coupled to the ground voltage, and a second terminal coupled to a fifth node; a first P-type transistor, wherein the first P-type transistor has a control terminal coupled to the fifth node, a first terminal coupled to the supply voltage, and a second terminal coupled to the fifth node; a second P-type transistor, wherein the second P-type transistor has a control terminal coupled to the fifth node, a first terminal coupled to the supply voltage, and a second terminal coupled to a first control node, and wherein the first control node is arranged for outputting the first control voltage; and a first capacitor, coupled between the first control node and the ground voltage.

In some embodiments, the common mode detector comprises a second circuit which comprises: a second AND gate, wherein the second AND gate has a first input terminal for receiving the second data voltage, a second input terminal for receiving the second comparison voltage, and an output terminal for outputting a second tuning voltage; a second inverter, wherein the second inverter has an input terminal for receiving the second tuning voltage, and an output terminal for outputting an inverted second tuning voltage; a third switch element, coupled between a sixth node and the ground voltage, wherein the third switch element is closed or opened according to the second tuning voltage; a fourth switch element, coupled between the supply voltage and the sixth node, wherein the fourth switch element is closed or opened according to the inverted second tuning voltage; a third P-type transistor, wherein the third P-type transistor has a control terminal coupled to the sixth node, a first terminal coupled to the supply voltage, and a second terminal coupled to a seventh node; a second N-type transistor, wherein the second N-type transistor has a control terminal coupled to the seventh node, a first terminal coupled to the ground voltage, and a second terminal coupled to the seventh node; a third N-type transistor, wherein the third N-type transistor has a control terminal coupled to the seventh node, a first terminal coupled to the ground voltage, and a second terminal coupled to a second control node, and wherein the second control node is arranged for outputting the second control voltage; and a second capacitor, coupled between the second control node and the ground voltage.

In some embodiments, the common mode detector comprises a third circuit which comprises: a third AND gate, wherein the third AND gate has a first input terminal for receiving the second data voltage, a second input terminal for receiving the first comparison voltage, and an output terminal for outputting a third tuning voltage; a third inverter, wherein the third inverter has an input terminal for receiving the third tuning voltage, and an output terminal for outputting an inverted third tuning voltage; a fifth switch element, coupled between the supply voltage and an eighth node, wherein the fifth switch element is closed or opened according to the third tuning voltage; a sixth switch element, coupled between the eighth node and the ground voltage, wherein the sixth switch element is closed or opened according to the inverted third tuning voltage; a fourth N-type transistor, wherein the fourth N-type transistor has a control terminal coupled to the eighth node, a first terminal coupled to the ground voltage, and a second terminal coupled to a ninth node; a fourth P-type transistor, wherein the fourth P-type transistor has a control terminal coupled to the ninth node, a first terminal coupled to the supply voltage, and a second terminal coupled to the ninth node; a fifth P-type transistor, wherein the fifth P-type transistor has a control terminal coupled to the ninth node, a first terminal coupled to the supply voltage, and a second terminal coupled to a third control node, and wherein the third control node is arranged for outputting the third control voltage; and a third capacitor, coupled between the third control node and the ground voltage.

In some embodiments, the common mode detector comprises a fourth circuit which comprises: a fourth AND gate, wherein the fourth AND gate has a first input terminal for receiving the first data voltage, a second input terminal for receiving the second comparison voltage, and an output terminal for outputting a fourth tuning voltage; a fourth inverter, wherein the fourth inverter has an input terminal for receiving the fourth tuning voltage, and an output terminal for outputting an inverted fourth tuning voltage; a seventh switch element, coupled between a tenth node and the ground voltage, wherein the seventh switch element is closed or opened according to the fourth tuning voltage; an eighth switch element, coupled between the supply voltage and the tenth node, wherein the eighth switch element is closed or opened according to the inverted fourth tuning voltage; a sixth P-type transistor, wherein the sixth P-type transistor has a control terminal coupled to the tenth node, a first terminal coupled to the supply voltage, and a second terminal coupled to an eleventh node; a fifth N-type transistor, wherein the fifth N-type transistor has a control terminal coupled to the eleventh node, a first terminal coupled to the ground voltage, and a second terminal coupled to the eleventh node; a sixth N-type transistor, wherein the sixth N-type transistor has a control terminal coupled to the eleventh node, a first terminal coupled to the ground voltage, and a second terminal coupled to a fourth control node, and wherein the fourth control node is arranged for outputting the fourth control voltage; and a fourth capacitor, coupled between the fourth control node and the ground voltage.

In some embodiments, the skew adjustment circuit comprises a fifth circuit which comprises: a seventh P-type transistor, wherein the seventh P-type transistor has a control terminal for receiving the first control voltage, a first terminal coupled to a supply voltage, and a second terminal coupled to a twelfth node; an eighth P-type transistor, wherein the eighth P-type transistor has a control terminal for receiving the first data voltage, a first terminal coupled to the twelfth node, and a second terminal coupled to a thirteenth node; a seventh N-type transistor, wherein the seventh N-type transistor has a control terminal for receiving the first data voltage, a first terminal coupled to a fourteenth node, and a second terminal coupled to the thirteenth node; an eighth N-type transistor, wherein the eighth N-type transistor has a control terminal for receiving the second control voltage, a first terminal coupled to a ground voltage, and a second terminal coupled to the fourteenth node; and a fifth inverter, wherein the fifth inverter has an input terminal coupled to the thirteenth node, and an output terminal for outputting the first output voltage.

In some embodiments, the skew adjustment circuit comprises a sixth circuit which comprises: a ninth P-type transistor, wherein the ninth P-type transistor has a control terminal for receiving the third control voltage, a first terminal coupled to the supply voltage, and a second terminal coupled to a fifteenth node; a tenth P-type transistor, wherein the tenth P-type transistor has a control terminal for receiving the second data voltage, a first terminal coupled to the fifteenth node, and a second terminal coupled to a sixteenth node; a ninth N-type transistor, wherein the ninth N-type transistor has a control terminal for receiving the second data voltage, a first terminal coupled to a seventeenth node, and a second terminal coupled to the sixteenth node; a tenth N-type transistor, wherein the tenth N-type transistor has a control terminal for receiving the fourth control voltage, a first terminal coupled to the ground voltage, and a second terminal coupled to the seventeenth node; and a sixth inverter, wherein the sixth inverter has an input terminal coupled to the sixteenth node, and an output terminal for outputting the second output voltage.

In some embodiments, the transmitter comprises: a current source, supplying a first current from a supply voltage to an eighteenth node; an eleventh P-type transistor, wherein the eleventh P-type transistor has a control terminal coupled to a second input node, a first terminal coupled to the eighteenth node, and a second terminal coupled to a first output node, and wherein the second input node is arranged for receiving the second output voltage; a twelfth P-type transistor, wherein the twelfth P-type transistor has a control terminal coupled to a first input node, a first terminal coupled to the eighteenth node, and a second terminal coupled to a second output node, and wherein the first input node is arranged for receiving the first output voltage; an eleventh N-type transistor, wherein the eleventh N-type transistor has a control terminal coupled to the second input node, a first terminal coupled to a nineteenth node, and a second terminal coupled to the first output node; a twelfth N-type transistor, wherein the twelfth N-type transistor has a control terminal coupled to the first input node, a first terminal coupled to the nineteenth node, and a second terminal coupled to the second output node; a current sink, drawing a second current from the nineteenth node to a ground voltage; a seventh resistor, coupled between the first output node and a twentieth node; and an eighth resistor, coupled between the second output node and the twentieth node, wherein the first output node and the second output node are arranged for outputting the pair of transmitter output signals.

BRIEF DESCRIPTION OF DRAWINGS

The invention can be more fully understood by reading the subsequent detailed description and examples with references made to the accompanying drawings, wherein:

FIG. 5A is a diagram of a fifth circuit of a skew adjustment circuit according to an embodiment of the invention;

FIG. 5B is a diagram of a sixth circuit of a skew adjustment circuit according to an embodiment of the invention;

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
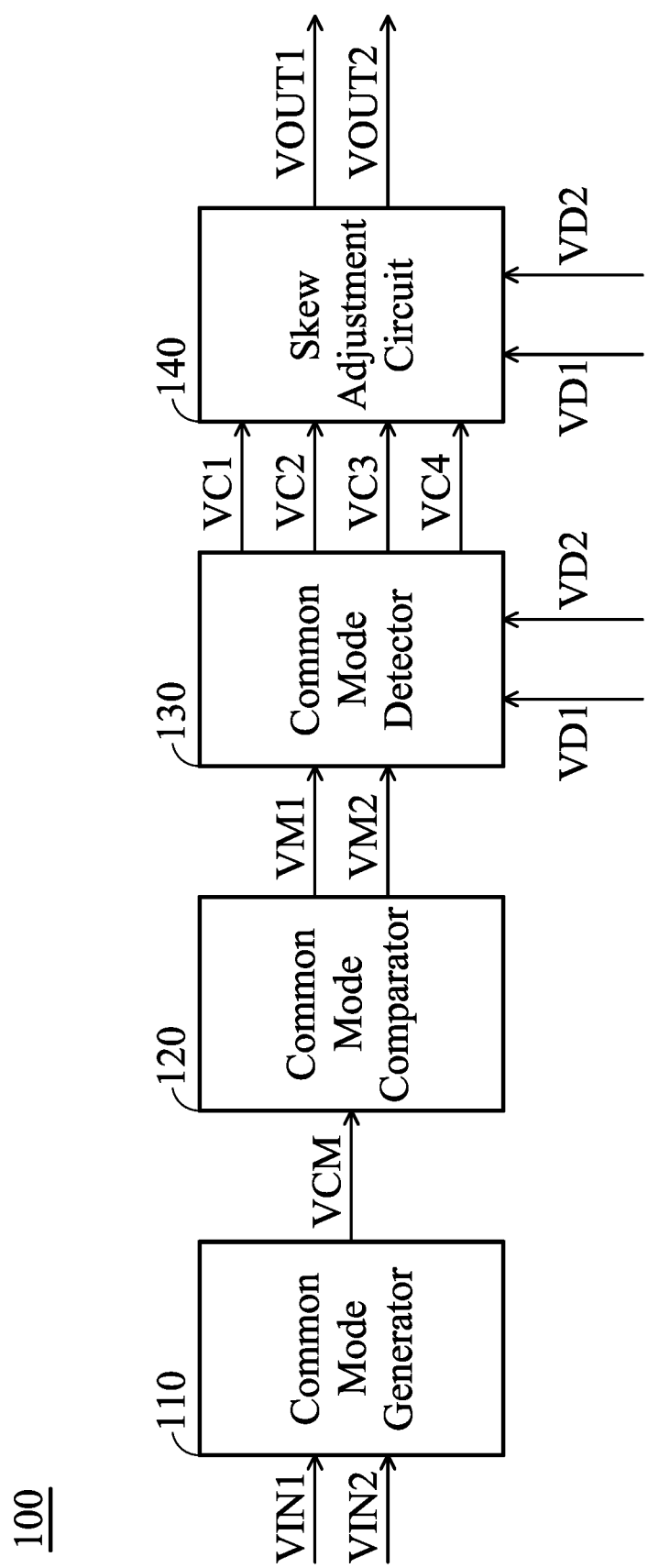
FIG. 1 is a diagram of a skew compensation circuit according to an embodiment of the invention.

FIG. 1 is a diagram of a skew compensation circuit 100 according to an embodiment of the invention. The skew compensation circuit 100 is used for a transmitter of a communication system (not shown). As shown in FIG. 1, the skew compensation circuit 100 includes a common mode generator 110, a common mode comparator 120, a common mode detector 130, and a skew adjustment circuit 140. The common mode generator 110 can receive a first input voltage VIN1 and a second input voltage VIN2 from the transmitter, such as via traces on a PCB (Printed Circuit Board). Next, the common mode generator 110 generates a common mode voltage VCM according to the first input voltage VIN1 and the second input voltage VIN2. The common mode comparator 120 generates a first comparison voltage VM1 and a second comparison voltage VM2 according to the common mode voltage VCM and a first reference voltage and a second reference voltage. The common mode detector 130 generates a first control voltage VC1, a second control voltage VC2, a third control voltage VC3, and a fourth control voltage VC4 according to the first comparison voltage VM1, the second comparison voltage VM2, a first data voltage VD1, and a second data voltage VD2. For example, the first data voltage VD1 and the second data voltage VD2 may be traditional differential digital signals for driving and controlling the transmitter, and the first data voltage VD1 and the second data voltage VD2 may have complementary logic levels. The skew adjustment circuit 140 generates a first output voltage VOUT1 and a second output voltage VOUT2 according to the first data voltage VD1, the second data voltage VD2, the first control voltage VC1, the second control voltage VC2, the third control voltage VC3, and the fourth control voltage VC4. The first output voltage VOUT1 and the second output voltage VOUT2 can be arranged to be coupled to the transmitter and used for controlling and driving the transmitter using a negative feedback mechanism, so as to compensate for the intra-pair skew in the communication system.

The following embodiments will introduce the detailed circuit structures of the skew compensation circuit 100. It should be understood that these figures and descriptions are merely exemplary, rather than limitations of the invention.

Figure 2:
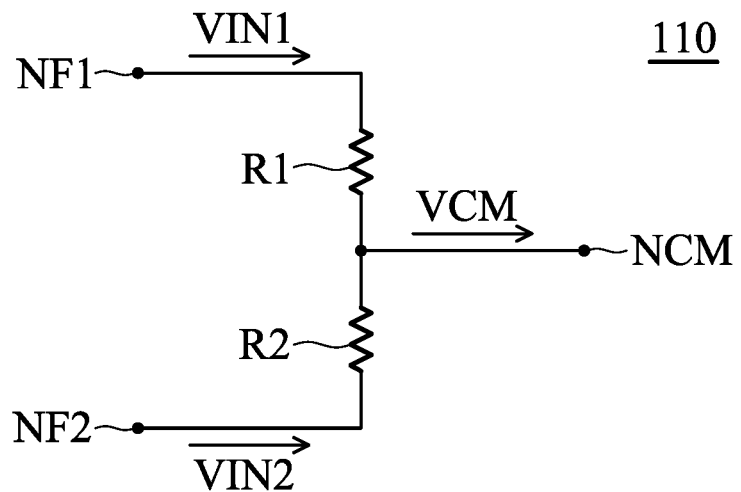
FIG. 2 is a diagram of a common mode generator according to an embodiment of the invention.

FIG. 2 is a diagram of the common mode generator 110 according to an embodiment of the invention. In the embodiment of FIG. 2, the common mode generator 110 includes a first resistor R1 and a second resistor R2. The first resistor R1 is coupled between a first far node NF1 and a common mode node NCM. The second resistor R2 is coupled between the common mode node NCM and a second far node NF2. The first far node NF1 and the second far node NF2 may be away from the transmitter outputs, i.e., coupled to the transmitter outputs by PCB traces. The first far node NF1 is arranged for receiving the first input voltage VIN1. The second far node NF2 is arranged for receiving the second input voltage VIN2. The common mode node NCM is arranged for outputting the common mode voltage VCM. For example, the resistance of the second resistor R2 may be the same as the resistance of the first resistor R1, such that the common mode voltage VCM may be an average voltage of the first input voltage VIN1 and the second input voltage VIN2 (i.e., $$\left(\text{i.e., } VCM = \frac{VIN1 + VIN2}{2}\right).$$

Figure 3:
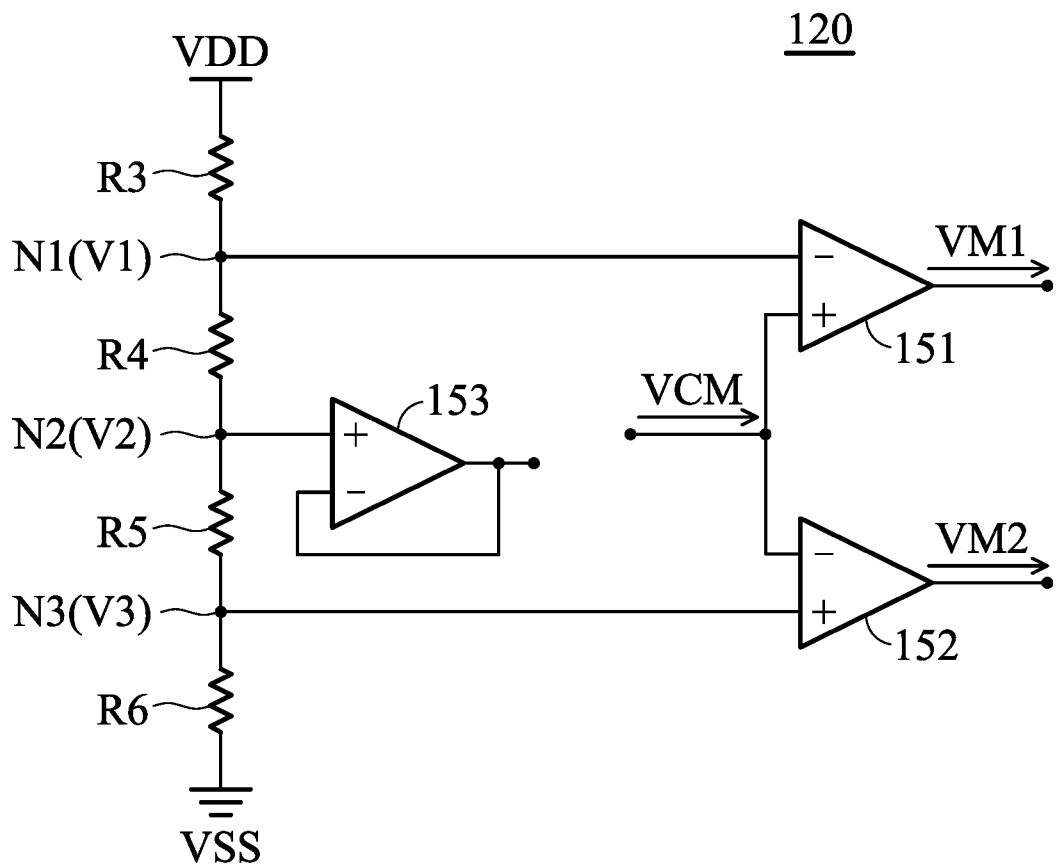
FIG. 3 is a diagram of a common mode comparator according to an embodiment of the invention.

FIG. 3 is a diagram of the common mode comparator 120 according to an embodiment of the invention. In the embodiment of FIG. 3, the common mode comparator 120 includes a third resistor R3, a fourth resistor R4, a fifth resistor R5, a sixth resistor R6, a first comparator 151, a second comparator 152, and an operational amplifier 153. The third resistor R3 is coupled between a supply voltage VDD (e.g., 1.2V) and a first node N1. The fourth resistor R4 is coupled between the first node N1 and a second node N2. The fifth resistor R5 is coupled between the second node N2 and a third node N3. The sixth resistor R6 is coupled between the third node N3 and a ground voltage VSS (e.g., 0V). The resistance of the sixth resistor R6 may be the same as the resistance of the third resistor R3, and the resistance of the fifth resistor R5 may be the same as the resistance of the fourth resistor R4. Thus, the voltage V2 at the second node N2 may be an average voltage of the supply voltage VDD and the ground voltage VSS (i.e., $$\left(\text{i.e., } V2 = \frac{VDD + VSS}{2}\right),$$

such as 0.6V. The first reference voltage V1 at the first node N1 may be slightly higher than the voltage V2 at the second node N2, such as 0.62V. The second reference voltage V3 at the third node N3 may be slightly lower than the voltage V2 at the second node N2, such as 0.58V. Each of the first comparator 151 and the second comparator 152 may be implemented with a respective operational amplifier. The first comparator 151 has a positive input terminal for receiving the common mode voltage VCM, a negative input terminal coupled to the first node N1 for receiving the first reference voltage V1, and an output terminal for outputting the first comparison voltage VM1. For example, if the common mode voltage VCM is higher than the first reference voltage V1, the first comparison voltage VM1 may have a high logic level, and conversely, if the common mode voltage VCM is lower than the first reference voltage V1, the first comparison voltage VM1 may have a low logic level. The second comparator 152 has a negative input terminal for receiving the common mode voltage VCM, a positive input terminal coupled to the third node N3 for receiving the second reference voltage V3, and an output terminal for outputting the second comparison voltage VM2. For example, if the common mode voltage VCM is higher than the second reference voltage V3, the second comparison voltage VM2 may have a low logic level, and conversely, if the common mode voltage VCM is lower than the second reference voltage V3, the second comparison voltage VM2 may have a high logic level. The operational amplifier 153 has a positive input terminal coupled to the second node N2, a negative input terminal, and an output terminal fed back to the negative input terminal, so as to form a unity gain buffer. In alternative embodiments, the operational amplifier 153 is removed from the common mode comparator 120.

In some embodiments, the common mode detector 130 includes a first circuit 131, a second circuit 132, a third circuit 133, and a fourth circuit 134, and the details of those structures are illustrated in FIGS. 4A to 4D. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor).

Figure 4A:
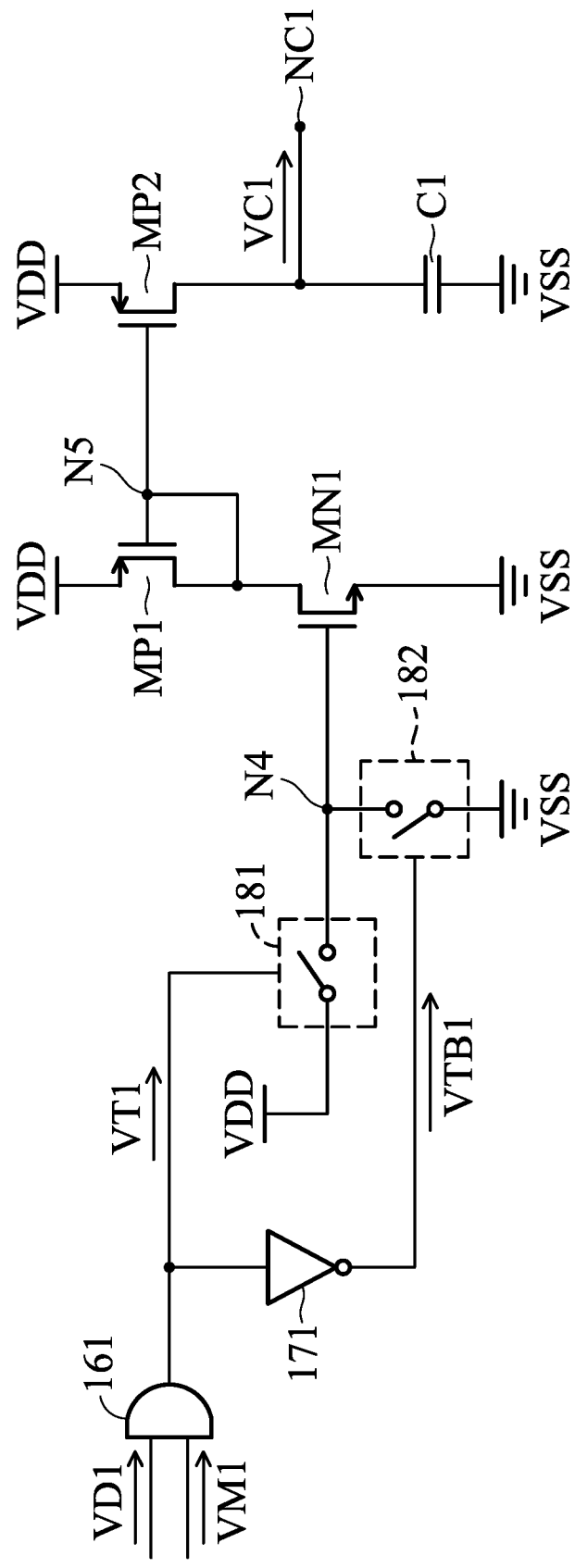
FIG. 4A is a diagram of a first circuit of a common mode detector according to an embodiment of the invention.

FIG. 4A is a diagram of the first circuit 131 of the common mode detector 130 according to an embodiment of the invention. In the embodiment of FIG. 4A, the first circuit 131 includes a first AND gate 161, a first inverter 171, a first switch element 181, a second switch element 182, a first P-type transistor MP1, a second P-type transistor MP2, a first N-type transistor MN1, and a first capacitor C1. The first AND gate 161 has a first input terminal for receiving the first data voltage VD1, a second input terminal for receiving the first comparison voltage VM1, and an output terminal for outputting a first tuning voltage VT1. The first inverter 171 has an input terminal for receiving the first tuning voltage VT1, and an output terminal for outputting an inverted first tuning voltage VTB1. The first tuning voltage VT1 and the inverted first tuning voltage VTB1 may have complementary logic levels. The first switch element 181 is coupled between the supply voltage VDD and a fourth node N4. The first switch element 181 is closed (i.e. conducting) or opened (i.e. not conducting) according to the first tuning voltage VT1. For example, if the first tuning voltage VT1 has a high logic level, the first switch element 181 may be closed, and conversely, if the first tuning voltage VT1 has a low logic level, the first switch element 181 may be opened. The second switch element 182 is coupled between the fourth node N4 and the ground voltage VSS. The second switch element 182 is closed or opened according to the inverted first tuning voltage VTB1. For example, if the inverted first tuning voltage VTB1 has a high logic level, the second switch element 182 may be closed, and conversely, if the inverted first tuning voltage VTB1 has a low logic level, the second switch element 182 may be opened. The first N-type transistor MN1 has a control terminal coupled to the fourth node N4, a first terminal coupled to the ground voltage VSS, and a second terminal coupled to a fifth node N5. The first P-type transistor MP1 has a control terminal coupled to the fifth node N5, a first terminal coupled to the supply voltage VDD, and a second terminal coupled to the fifth node N5. The second P-type transistor MP2 has a control terminal coupled to the fifth node N5, a first terminal coupled to the supply voltage VDD, and a second terminal coupled to a first control node NC1. A first current mirror may be formed by the first P-type transistor MP1 and the second P-type transistor MP2. The first capacitor C1 is coupled between the first control node NC1 and the ground voltage VSS. The first control node NC1 is arranged for outputting the first control voltage VC1. Therefore, when the first tuning voltage VT1 has a high logic level, the first control voltage VC1 is pulled up by the first current mirror; when the first tuning voltage VT1 has a low logic level, the first current mirror is disabled and the first capacitor C1 holds the voltage level of the first control voltage VC1.

Figure 4B:
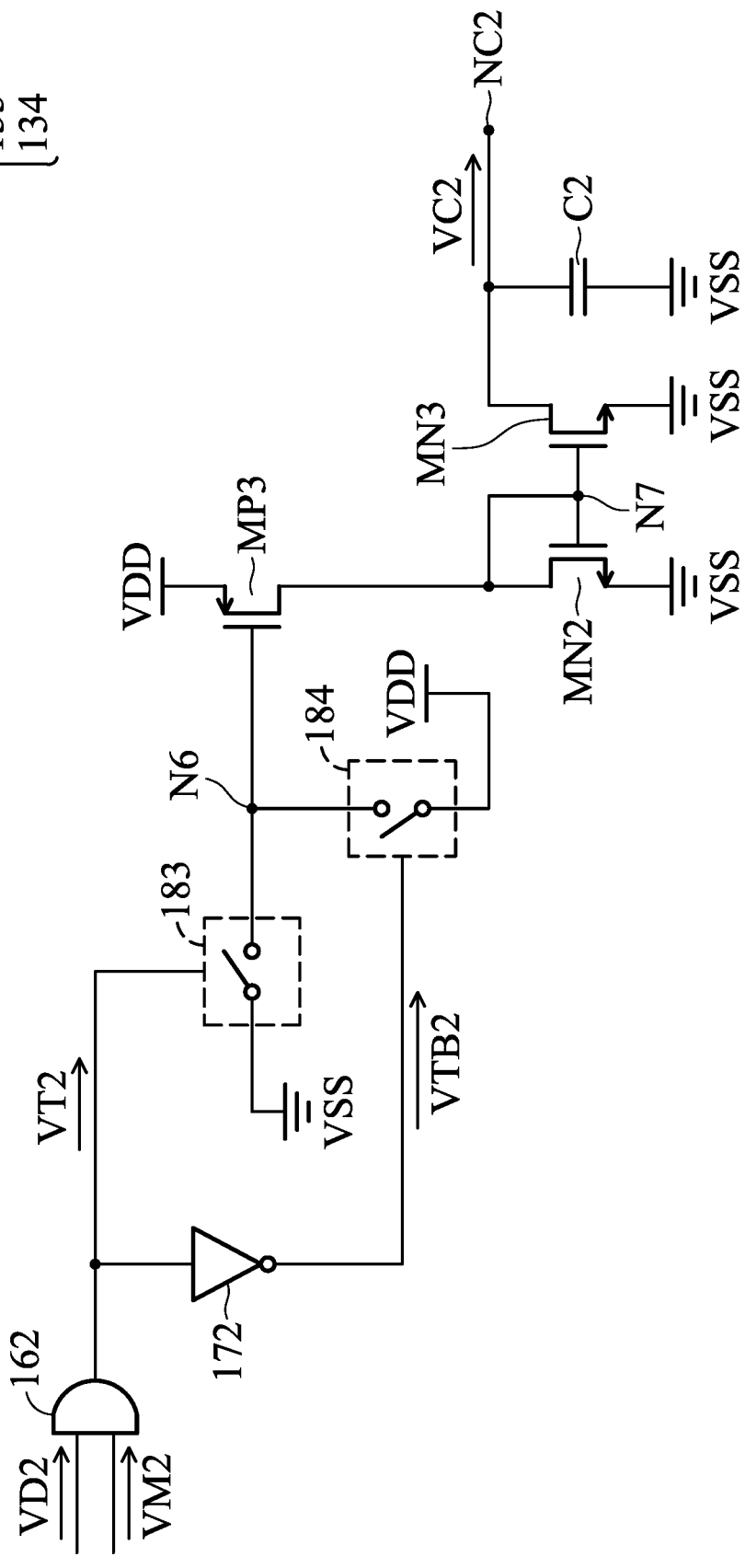
FIG. 4B is a diagram of a second circuit of a common mode detector according to an embodiment of the invention.

FIG. 4B is a diagram of the second circuit 132 of the common mode detector 130 according to an embodiment of the invention. In the embodiment of FIG. 4B, the second circuit 132 includes a second AND gate 162, a second inverter 172, a third switch element 183, a fourth switch element 184, a third P-type transistor MP3, a second N-type transistor MN2, a third N-type transistor MN3, and a second capacitor C2. The second AND gate 162 has a first input terminal for receiving the second data voltage VD2, a second input terminal for receiving the second comparison voltage VM2, and an output terminal for outputting a second tuning voltage VT2. The second inverter 172 has an input terminal for receiving the second tuning voltage VT2, and an output terminal for outputting an inverted second tuning voltage VTB2. The second tuning voltage VT2 and the inverted second tuning voltage VTB2 may have complementary logic levels. The third switch element 183 is coupled between a sixth node N6 and the ground voltage VSS. The third switch element 183 is closed or opened according to the second tuning voltage VT2. For example, if the second tuning voltage VT2 has a high logic level, the third switch element 183 may be closed, and conversely, if the second tuning voltage VT2 has a low logic level, the third switch element 183 may be opened. The fourth switch element 184 is coupled between the supply voltage VDD and the sixth node N6. The fourth switch element 184 is closed or opened according to the inverted second tuning voltage VTB2. For example, if the inverted second tuning voltage VTB2 has a high logic level, the fourth switch element 184 may be closed, and conversely, if the inverted second tuning voltage VTB2 has a low logic level, the fourth switch element 184 may be opened. The third P-type transistor MP3 has a control terminal coupled to the sixth node N6, a first terminal coupled to the supply voltage VDD, and a second terminal coupled to a seventh node N7. The second N-type transistor MN2 has a control terminal coupled to the seventh node N7, a first terminal coupled to the ground voltage VSS, and a second terminal coupled to the seventh node N7. The third N-type transistor MN3 has a control terminal coupled to the seventh node N7, a first terminal coupled to the ground voltage VSS, and a second terminal coupled to a second control node NC2. A second current mirror may be formed by the second N-type transistor MN2 and the third N-type transistor MN3. The second capacitor C2 is coupled between the second control node NC2 and the ground voltage VSS. The second control node NC2 is arranged for outputting the second control voltage VC2. Therefore, when the second tuning voltage VT2 has a high logic level, the second control voltage VC2 is pulled down by the second current mirror; when the second tuning voltage VT2 has a low logic level, the second current mirror is disabled and the second capacitor C2 holds the voltage level of the second control voltage VC2.

Figure 4C:
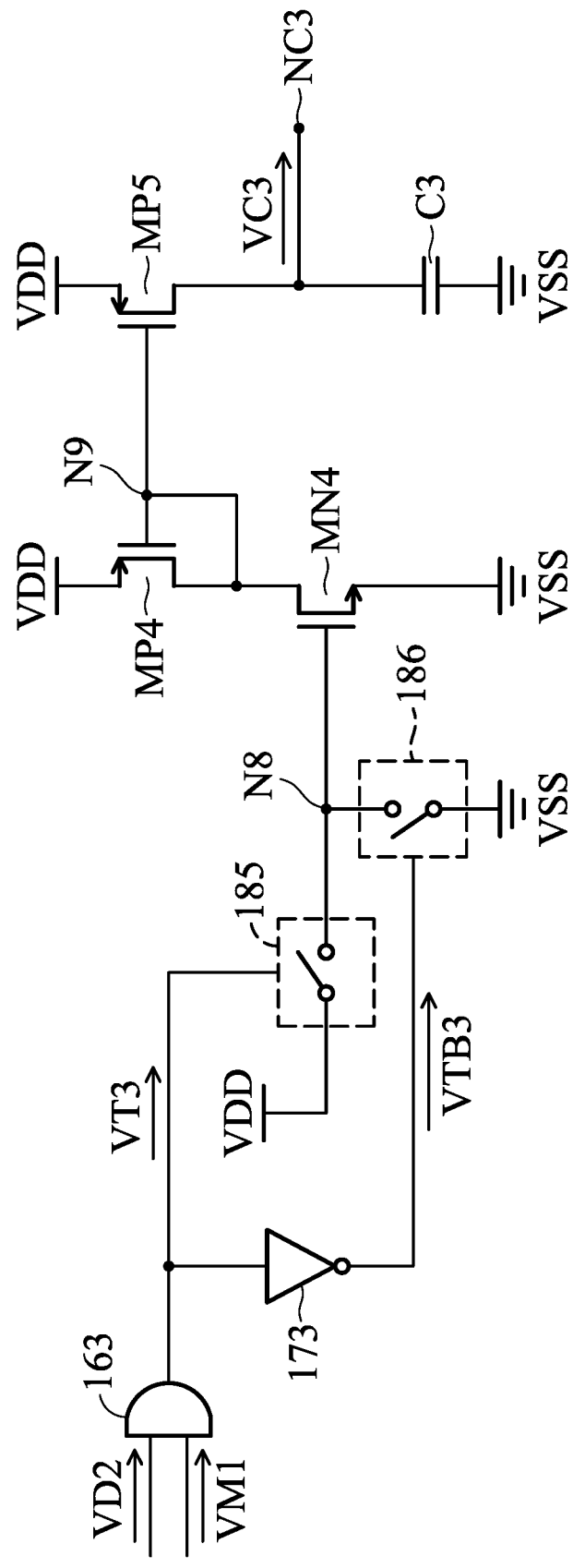
FIG. 4C is a diagram of a third circuit of a common mode detector according to an embodiment of the invention.

FIG. 4C is a diagram of the third circuit 133 of the common mode detector 130 according to an embodiment of the invention. In the embodiment of FIG. 4C, the third circuit 133 includes a third AND gate 163, a third inverter 173, a fifth switch element 185, a sixth switch element 186, a fourth P-type transistor MP4, a fifth P-type transistor MP5, a fourth N-type transistor MN4, and a third capacitor C3. The third AND gate 163 has a first input terminal for receiving the second data voltage VD2, a second input terminal for receiving the first comparison voltage VM1, and an output terminal for outputting a third tuning voltage VT3. The third inverter 173 has an input terminal for receiving the third tuning voltage VT3, and an output terminal for outputting an inverted third tuning voltage VTB3. The third tuning voltage VT3 and the inverted third tuning voltage VTB3 may have complementary logic levels. The fifth switch element 185 is coupled between the supply voltage VDD and an eighth node N8. The fifth switch element 185 is closed or opened according to the third tuning voltage VT3. For example, if the third tuning voltage VT3 has a high logic level, the fifth switch element 185 may be closed, and conversely, if the third tuning voltage VT3 has a low logic level, the fifth switch element 185 may be opened. The sixth switch element 186 is coupled between the eighth node N8 and the ground voltage VSS. The sixth switch element 186 is closed or opened according to the inverted third tuning voltage VTB3. For example, if the inverted third tuning voltage VTB3 has a high logic level, the sixth switch element 186 may be closed, and conversely, if the inverted third tuning voltage VTB3 has a low logic level, the sixth switch element 186 may be opened. The fourth N-type transistor MN4 has a control terminal coupled to the eighth node N8, a first terminal coupled to the ground voltage VSS, and a second terminal coupled to a ninth node N9. The fourth P-type transistor MP4 has a control terminal coupled to the ninth node N9, a first terminal coupled to the supply voltage VDD, and a second terminal coupled to the ninth node N9. The fifth P-type transistor MP5 has a control terminal coupled to the ninth node N9, a first terminal coupled to the supply voltage VDD, and a second terminal coupled to a third control node NC3. A third current mirror may be formed by the fourth P-type transistor MP4 and the fifth P-type transistor MP5. The third capacitor C3 is coupled between the third control node NC3 and the ground voltage VSS. The third control node NC3 is arranged for outputting the third control voltage VC3. Therefore, when the third tuning voltage VT3 has a high logic level, the third control voltage VC3 is pulled up by the third current mirror; when the third tuning voltage VT3 has a low logic level, the third current mirror is disabled and the third capacitor C3 holds the voltage level of the third control voltage VC3.

Figure 4D:
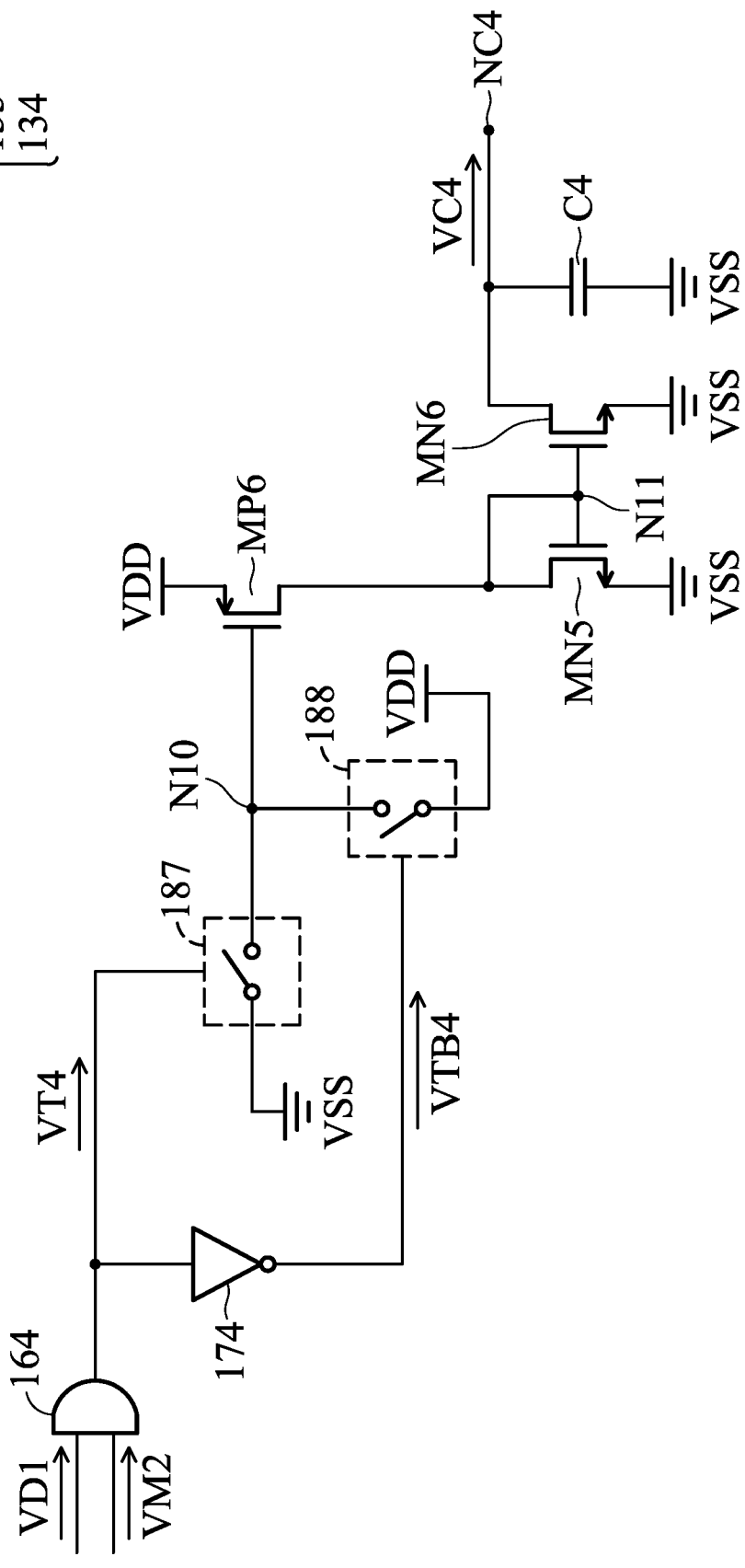
FIG. 4D is a diagram of a fourth circuit of a common mode detector according to an embodiment of the invention.

FIG. 4D is a diagram of the fourth circuit 134 of the common mode detector 130 according to an embodiment of the invention. In the embodiment of FIG. 4D, the fourth circuit 134 includes a fourth AND gate 164, a fourth inverter 174, a seventh switch element 187, an eighth switch element 188, a sixth P-type transistor MP6, a fifth N-type transistor MN5, a sixth N-type transistor MN6, and a fourth capacitor C4. The fourth AND gate 164 has a first input terminal for receiving the first data voltage VD1, a second input terminal for receiving the second comparison voltage VM2, and an output terminal for outputting a fourth tuning voltage VT4. The fourth inverter 174 has an input terminal for receiving the fourth tuning voltage VT4, and an output terminal for outputting an inverted fourth tuning voltage VTB4. The fourth tuning voltage VT4 and the inverted fourth tuning voltage VTB4 may have complementary logic levels. The seventh switch element 187 is coupled between a tenth node N10 and the ground voltage VSS. The seventh switch element 187 is closed or opened according to the fourth tuning voltage VT4. For example, if the fourth tuning voltage VT4 has a high logic level, the seventh switch element 187 may be closed, and conversely, if the fourth tuning voltage VT4 has a low logic level, the seventh switch element 187 may be opened. The eighth switch element 188 is coupled between the supply voltage VDD and the tenth node N10. The eighth switch element 188 is closed or opened according to the inverted fourth tuning voltage VTB4. For example, if the inverted fourth tuning voltage VTB4 has a high logic level, the eighth switch element 188 may be closed, and conversely, if the inverted fourth tuning voltage VTB4 has a low logic level, the eighth switch element 188 may be opened. The sixth P-type transistor MP6 has a control terminal coupled to the tenth node N10, a first terminal coupled to the supply voltage VDD, and a second terminal coupled to an eleventh node N11. The fifth N-type transistor MN5 has a control terminal coupled to the eleventh node N11, a first terminal coupled to the ground voltage VSS, and a second terminal coupled to the eleventh node N11. The sixth N-type transistor MN6 has a control terminal coupled to the eleventh node N11, a first terminal coupled to the ground voltage VSS, and a second terminal coupled to a fourth control node NC4. A fourth current mirror may be formed by the fifth N-type transistor MN5 and the sixth P-type transistor MN6. The fourth capacitor C4 is coupled between the fourth control node NC4 and the ground voltage VSS. The fourth control node NC4 is arranged for outputting the fourth control voltage VC4. Therefore, when the fourth tuning voltage VT4 has a high logic level, the fourth control voltage VC4 is pulled down by the fourth current mirror; when the fourth tuning voltage VT4 has a low logic level, the fourth current mirror is disabled and the fourth capacitor C4 holds the voltage level of the fourth control voltage VC4.

In some embodiments, the skew adjustment circuit 140 includes a fifth circuit 145 and a sixth circuit 146, and the details of those structures are illustrated in FIGS. 5A and 5B. For example, each P-type transistor may be a PMOS transistor, and each N-type transistor may be an NMOS transistor.

FIG. 5A is a diagram of the fifth circuit 145 of the skew adjustment circuit 140 according to an embodiment of the invention. In the embodiment of FIG. 5A, the fifth circuit 145 includes a seventh P-type transistor MP7, an eighth P-type transistor MP8, a seventh N-type transistor MN7, an eighth N-type transistor MN8, and a fifth inverter 175. The seventh P-type transistor MP7 has a control terminal for receiving the first control voltage VC1, a first terminal coupled to the supply voltage VDD, and a second terminal coupled to a twelfth node N12. The eighth P-type transistor MP8 has a control terminal for receiving the first data voltage VD1, a first terminal coupled to the twelfth node N12, and a second terminal coupled to a thirteenth node N13. The seventh N-type transistor MN7 has a control terminal for receiving the first data voltage VD1, a first terminal coupled to a fourteenth node N14, and a second terminal coupled to the thirteenth node N13. The eighth N-type transistor MN8 has a control terminal for receiving the second control voltage VC2, a first terminal coupled to the ground voltage VSS, and a second terminal coupled to the fourteenth node N14. The fifth inverter 175 has an input terminal coupled to the thirteenth node N13, and an output terminal for outputting the first output voltage VOUT1. The first data voltage VD1 is delayed for a first tunable delay time so as to form the first output voltage VOUT1. For example, if the first control voltage VC1 is set at a low logic level and the second control voltage VC2 is set at a high logic level at initialization, the first tunable delay time may be the shortest (since the current flowing through the seventh P-type transistor MP7, the eighth P-type transistor MP8, the seventh N-type transistor MN7, and the eighth N-type transistor MN8 is the largest), and conversely, if the first control voltage VC1 rises up and the second control voltage VC2 drops down (as respectively controlled by the first circuit 131 and the second circuit 132 of the common mode detector 130), the first tunable delay time may become longer. In alternative embodiments, the fifth inverter 175 is replaced with any odd number of cascading inverters, so as to keep the first output voltage VOUT1 and the first data voltage VD1 in the same logic level.

FIG. 5B is a diagram of the sixth circuit 146 of the skew adjustment circuit 140 according to an embodiment of the invention. In the embodiment of FIG. 5B, the sixth circuit 146 includes a ninth P-type transistor MP9, a tenth P-type transistor MP10, a ninth N-type transistor MN9, a tenth N-type transistor MN10, and a sixth inverter 176. The ninth P-type transistor MP9 has a control terminal for receiving the third control voltage VC3, a first terminal coupled to the supply voltage VDD, and a second terminal coupled to a fifteenth node N15. The tenth P-type transistor MP10 has a control terminal for receiving the second data voltage VD2, a first terminal coupled to the fifteenth node N15, and a second terminal coupled to a sixteenth node N16. The ninth N-type transistor MN9 has a control terminal for receiving the second data voltage VD2, a first terminal coupled to a seventeenth node N17, and a second terminal coupled to the sixteenth node N16. The tenth N-type transistor MN10 has a control terminal for receiving the fourth control voltage VC4, a first terminal coupled to the ground voltage VSS, and a second terminal coupled to the seventeenth node N17. The sixth inverter 176 has an input terminal coupled to the sixteenth node N16, and an output terminal for outputting the second output voltage VOUT2. The second data voltage VD2 is delayed for a second tunable delay time so as to form the second output voltage VOUT2. For example, if the third control voltage VC3 is set at a low logic level and the fourth control voltage VC4 is set at a high logic level at initialization, the second tunable delay time may be the shortest (since the current flowing through the ninth P-type transistor MP9, the tenth P-type transistor MP10, the ninth N-type transistor MN9, and the tenth N-type transistor MN10 is the largest), and conversely, if the third control voltage VC3 rises up and the fourth control voltage VC4 drops down (as respectively controlled by the third circuit 133 and the fourth circuit 134 of the common mode detector 130), the second tunable delay time may become longer. In alternative embodiments, the sixth inverter 176 is replaced with any odd number of cascading inverters, so as to keep the second output voltage VOUT2 and the second data voltage VD2 in the same logic level.

Figure 6:
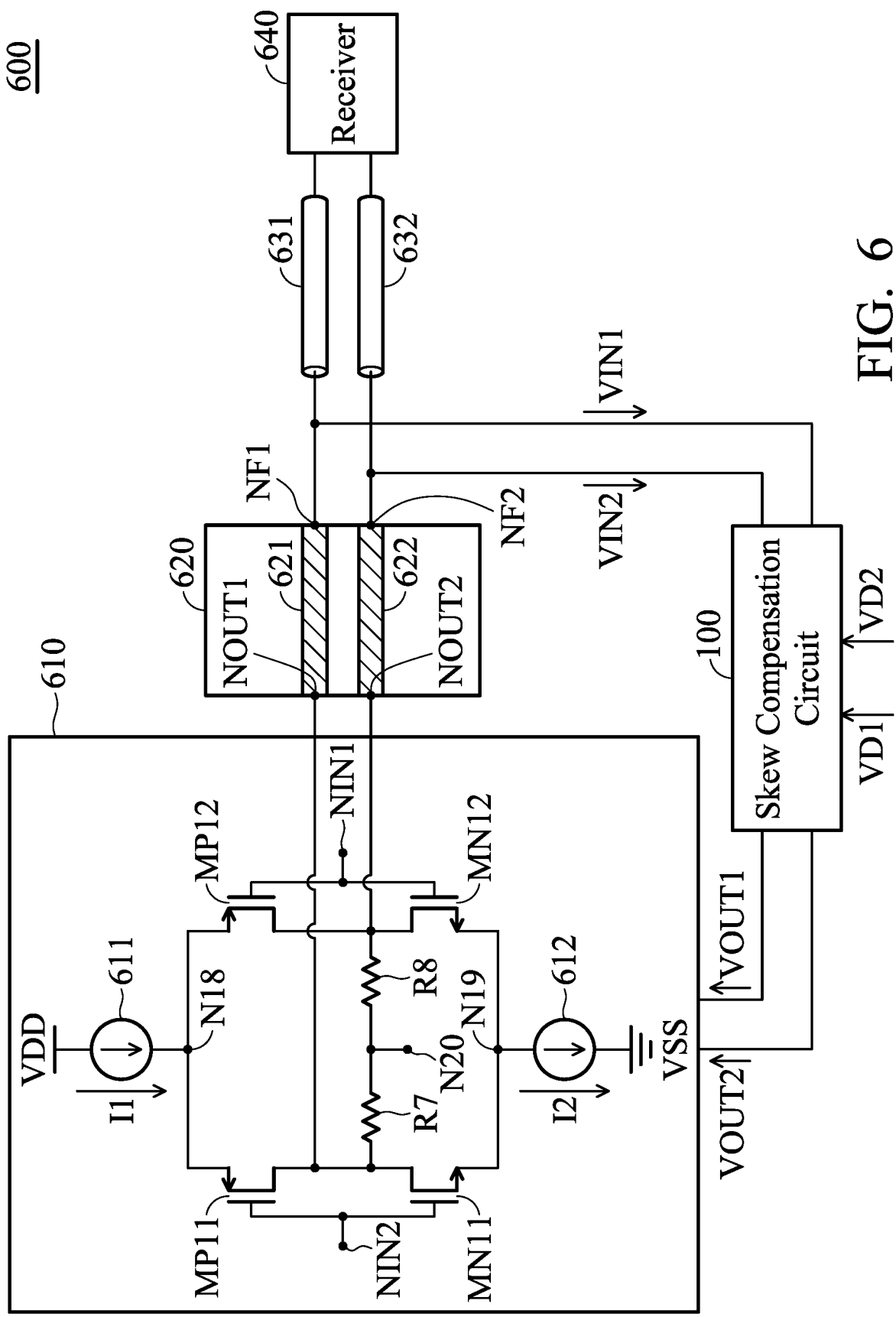
FIG. 6 is a diagram of a communication system using a skew compensation circuit according to an embodiment of the invention.

FIG. 6 is a diagram of a communication system 600 using the skew compensation circuit 100 according to an embodiment of the invention. In the embodiment of FIG. 6, the communication system 600 includes a transmitter 610, a PCB (Printed Circuit Board) 620 with a first trace 621 and a second trace 622 thereon, a pair of transmission lines 631 and 632, and a receiver 640. In some embodiments, the transmitter 610 may also be located on the PCB 620. Generally, the first input voltage VIN1 and the second input voltage VIN2 of the skew compensation circuit 100 are respectively received through the first trace 621 and the second trace 622 on the PCB 620 from two output nodes of the transmitter 610 that outputs a pair of transmitter output signals, and the first output voltage VOUT1 and the second output voltage VOUT2 of the skew compensation circuit 100 are output to two input nodes of the transmitter 610. The skew compensation circuit 100 is configured to reduce the intra-pair skew in the communication system 600. The operation principles of the skew compensation circuit 100 will be described in detail as follows.

Specifically, the transmitter 610 includes a current source 611, a current sink 612, an eleventh P-type transistor MP11, a twelfth P-type transistor MP12, an eleventh N-type transistor MN11, a twelfth N-type transistor MN12, a seventh resistor R7, and an eighth resistor R8. Each P-type transistor may be a PMOS transistor, and each N-type transistor may be an NMOS transistor. The current source 611 supplies a first current I1 from the supply voltage VDD to an eighteenth node N18. The current sink 612 draws a second current I2 from a nineteenth node N19 to the ground voltage VSS. The second current I2 may be the same as the first current I1. The eleventh P-type transistor MP11 has a control terminal coupled to a second input node NIN2, a first terminal coupled to the eighteenth node N18, and a second terminal coupled to a first output node NOUT1. The twelfth P-type transistor MP12 has a control terminal coupled to a first input node NIN1, a first terminal coupled to the eighteenth node N18, and a second terminal coupled to a second output node NOUT2. The eleventh N-type transistor MN11 has a control terminal coupled to the second input node NIN2, a first terminal coupled to the nineteenth node N19, and a second terminal coupled to the first output node NOUT1. The twelfth N-type transistor MN12 has a control terminal coupled to the first input node NIN1, a first terminal coupled to the nineteenth node N19, and a second terminal coupled to the second output node NOUT2. The seventh resistor R7 is coupled between the first output node NOUT1 and a twentieth node N20. The eighth resistor R8 is coupled between the second output node NOUT2 and the twentieth node N20. In some embodiments, the twentieth node N20 is coupled to the output terminal of the operational amplifier 153 (as shown in FIG. 3) so as to provide a common mode voltage at the twentieth node N20.

The first input node NIN1 of the transmitter 610 is arranged for receiving the first output voltage VOUT1 from the skew compensation circuit 100. The second input node NIN2 of the transmitter 610 is arranged for receiving the second output voltage VOUT2 from the skew compensation circuit 100. The first output node NOUT1 of the transmitter 610 is coupled through the first trace 621 on the PCB 620 to the first far node NF1. The second output node NOUT2 of the transmitter 610 is coupled through the second trace 622 on the PCB 620 to the second far node NF2. The skew compensation circuit 100 receives the first input voltage VIN1 and the second input voltage VIN2 from the first far node NF1 and the second far node NF2, respectively. In other words, a pair of differential output voltages of the transmitter 610 are transmitted through the PCB 620 to the skew compensation circuit 100, the transmission lines 631 and 632, and the receiver 640. The intra-pair skew results from the difference between the lengths of the first trace 621 and the second trace 622 on the PCB 620. If the length of the first trace 621 is longer than the length of the second trace 622, the phase of the first input voltage VIN1 may be lagging the phase of the second input voltage VIN2, and conversely, if the length of the first trace 621 is shorter than the length of the second trace 622, the phase of the first input voltage VIN1 may be leading the phase of the second input voltage VIN2. However, the first input voltage VIN1 and the second input voltage VIN2 should have the same phases in an ideal case so that the receiver 640 may receive in-phase differential signals. In order to solve the problem, the skew compensation circuit 100 is used for fine-tuning the transmitter 610 using a negative feedback mechanism. It should be noted that in this embodiment, the transmitter 610 is driven and controlled by the first output voltage VOUT1 and the second output voltage VOUT2 of the skew compensation circuit 100, instead of the first data voltage VD1 and the second data voltage VD2 as in the conventional design.

Figure 7:
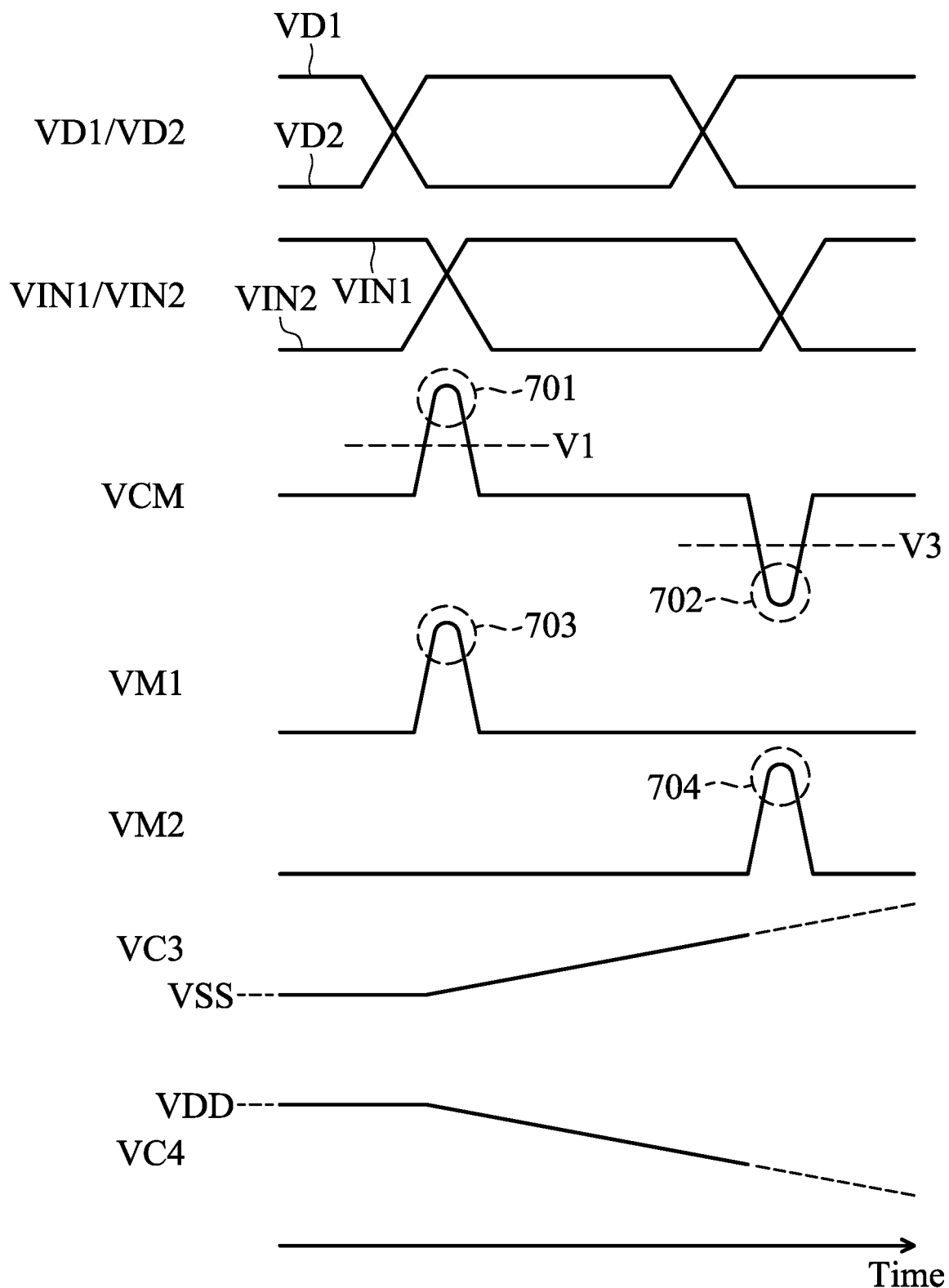
FIG. 7 is a diagram of voltage waveforms of a skew compensation circuit according to an embodiment of the invention.

FIG. 7 is a diagram of voltage waveforms of the skew compensation circuit 100 according to an embodiment of the invention. The horizontal axis represents time, and the vertical axis represents each voltage level. Please refer to FIGS. 1 to 7 together to understand the operation principle of the skew compensation circuit 100. Initially, the phases of the first data voltage VD1 and the second data voltage VD2 are synchronized (in an ideal case). Next, the pair of differential output voltages of the transmitter 610 are transmitted through the PCB 620. As shown in FIG. 7, it is assumed that the length of the first trace 621 is longer than the length of the second trace 622, and the phase of the first input voltage VIN1 is lagging the phase of the second input voltage VIN2. Thus, the common mode voltage VCM generates a first pulse 701 which is higher than the first reference voltage V1 at the first node N1, and a second pulse 702 which is lower than the second reference voltage V3 at the third node N3. In response, the first comparison voltage VM1 generates a third pulse 703 corresponding to the first pulse 701 of the common mode voltage VCM, and the second comparison voltage VM2 generates a fourth pulse 704 corresponding to the second pulse 702 of the common mode voltage VCM. Then, the third control voltage VC3 is gradually charged up according to the third pulse 703 of the first comparison voltage VM1, and the fourth control voltage VC4 is gradually discharged down according to the fourth pulse 704 of the second comparison voltage VM2. On the other hand, the first control voltage VC1 and the second control voltage VC2 are kept unchanged. Finally, the second tunable delay time of the second output voltage VOUT2 relative to the second data voltage VD2 is fine-tuned and optimized, so as to eliminate the intra-pair skew caused by the lagging first input voltage VIN1. That is, the second output voltage VOUT2 is generated by delaying the second data voltage VD2 by the second tunable delay time determined by the third control voltage VC3 and the fourth control voltage VC4.

On the contrary, it may also be assumed that the length of the first trace 621 is shorter than the length of the second trace 622, and the phase of the first input voltage VIN1 is leading the phase of the second input voltage VIN2 (not shown in FIG. 7). Under these circumstances, the first control voltage VC1 is gradually charged up, and the second control voltage VC2 is gradually discharged down. On the other hand, the third control voltage VC3 and the fourth control voltage VC4 are kept unchanged. Finally, the first tunable delay time of the first output voltage VOUT1 relative to the first data voltage VD1 is fine-tuned and optimized, so as to eliminate the intra-pair skew caused by the leading first input voltage VIN1. That is, the first output voltage VOUT1 is generated by delaying the first data voltage VD1 by the first tunable delay time determined by the first control voltage VC1 and the second control voltage VC2.

The invention provides a novel skew compensation circuit. In conclusion, the proposed design has at least the following advantages over the prior art: (1) compensating for the intra-pair skew in the communication system, (2) providing high transmission and operation speed, (3) suppressing EMI (Electromagnetic Disturbance), (4) enlarging the eye-diagram, and (5) being more insensitive to PVT (Process, Voltage, and Temperature) variations.

Note that the above voltages, currents, resistances, inductances, capacitances and other element parameters are not limitations of the invention. A designer can adjust these parameters according to different requirements. The skew compensation circuit of the invention is not limited to the configurations of FIGS. 1-7. The invention may merely include any one or more features of any one or more embodiments of FIGS. 1-7. In other words, not all of the features displayed in the figures should be implemented in the skew compensation circuit of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention.

It is intended that the standard and examples be considered exemplary only, with the true scope of the disclosed embodiments being indicated by the following claims and their equivalents.

What is claimed is:

1. A skew compensation circuit used for a transmitter, the transmitter generating a pair of transmitter output signals according to a first data voltage and a second data voltage, the skew compensation circuit comprising:
   a common mode generator, receiving a first input voltage and a second input voltage, wherein the first input voltage and the second input voltage are generated from the pair of transmitter output signals of the transmitter, wherein the common mode generator generates a common mode voltage according to the first input voltage and the second input voltage;
   a common mode comparator, generating a first comparison voltage and a second comparison voltage by comparing the common mode voltage with a first reference voltage and a second reference voltage, respectively;
   a common mode detector, generating a first control voltage, a second control voltage, a third control voltage, and a fourth control voltage according to the first comparison voltage, the second comparison voltage, the first data voltage, and the second data voltage; and
   a skew adjustment circuit, generating a first output voltage by delaying the first data voltage by a first tunable delay time determined by the first control voltage and the second control voltage, and generating a second output voltage by delaying the second data voltage by a second tunable delay time determined by the third control voltage and the fourth control voltage, wherein the first output voltage and the second output voltage are arranged for controlling the transmitter to generate the pair of transmitter output signals.

2. The skew compensation circuit as claimed in claim 1, wherein the first input voltage and the second input voltage are respectively received through a first trace and a second trace on a PCB (Printed Circuit Board) from output nodes of the transmitter, and wherein the first output voltage and the second output voltage are output to input nodes of the transmitter.

3. The skew compensation circuit as claimed in claim 1, wherein the common mode generator comprises:
   a first resistor, coupled between a first far node and a common mode node, wherein the first far node is arranged for receiving the first input voltage, and the common mode node is arranged for outputting the common mode voltage; and
   a second resistor, coupled between the common mode node and a second far node, wherein the second far node is arranged for receiving the second input voltage.

4. The skew compensation circuit as claimed in claim 1, wherein the common mode comparator comprises:
   a third resistor, coupled between a supply voltage and a first node;
   a fourth resistor, coupled between the first node and a second node;
   a fifth resistor, coupled between the second node and a third node;
   a sixth resistor, coupled between the third node and a ground voltage;
   a first comparator, wherein the first comparator has a positive input terminal for receiving the common mode voltage, a negative input terminal coupled to the first node, and an output terminal for outputting the first comparison voltage; and
   a second comparator, wherein the second comparator has a negative input terminal for receiving the common mode voltage, a positive input terminal coupled to the third node, and an output terminal for outputting the second comparison voltage.

5. The skew compensation circuit as claimed in claim 1, wherein the common mode detector generates the first control voltage according to the first comparison voltage and the first data voltage, generates the second control voltage according to the second comparison voltage and the second data voltage, generates the third control voltage according to the first comparison voltage and the second data voltage, and generates the fourth control voltage according to the second comparison voltage and the first data voltage.

6. The skew compensation circuit as claimed in claim 1, wherein the skew adjustment circuit comprises a fifth circuit which comprises:
   a seventh P-type transistor, wherein the seventh P-type transistor has a control terminal for receiving the first control voltage, a first terminal coupled to a supply voltage, and a second terminal coupled to a twelfth node;
   an eighth P-type transistor, wherein the eighth P-type transistor has a control terminal for receiving the first data voltage, a first terminal coupled to the twelfth node, and a second terminal coupled to a thirteenth node;
   a seventh N-type transistor, wherein the seventh N-type transistor has a control terminal for receiving the first data voltage, a first terminal coupled to a fourteenth node, and a second terminal coupled to the thirteenth node;
   an eighth N-type transistor, wherein the eighth N-type transistor has a control terminal for receiving the second control voltage, a first terminal coupled to a ground voltage, and a second terminal coupled to the fourteenth node; and
   a fifth inverter, wherein the fifth inverter has an input terminal coupled to the thirteenth node, and an output terminal for outputting the first output voltage.

7. The skew compensation circuit as claimed in claim 1, wherein the skew adjustment circuit comprises a sixth circuit which comprises:
   a ninth P-type transistor, wherein the ninth P-type transistor has a control terminal for receiving the third control voltage, a first terminal coupled to a supply voltage, and a second terminal coupled to a fifteenth node;
   a tenth P-type transistor, wherein the tenth P-type transistor has a control terminal for receiving the second data voltage, a first terminal coupled to the fifteenth node, and a second terminal coupled to a sixteenth node;
   a ninth N-type transistor, wherein the ninth N-type transistor has a control terminal for receiving the second data voltage, a first terminal coupled to a seventeenth node, and a second terminal coupled to the sixteenth node;
   a tenth N-type transistor, wherein the tenth N-type transistor has a control terminal for receiving the fourth control voltage, a first terminal coupled to a ground voltage, and a second terminal coupled to the seventeenth node; and
   a sixth inverter, wherein the sixth inverter has an input terminal coupled to the sixteenth node, and an output terminal for outputting the second output voltage.

8. The skew compensation circuit as claimed in claim 1, wherein the transmitter comprises:
- a current source, supplying a first current from a supply voltage to an eighteenth node;
- an eleventh P-type transistor, wherein the eleventh P-type transistor has a control terminal coupled to a second input node, a first terminal coupled to the eighteenth node, and a second terminal coupled to a first output node, and wherein the second input node is arranged for receiving the second output voltage;
- a twelfth P-type transistor, wherein the twelfth P-type transistor has a control terminal coupled to a first input node, a first terminal coupled to the eighteenth node, and a second terminal coupled to a second output node, and wherein the first input node is arranged for receiving the first output voltage;
- an eleventh N-type transistor, wherein the eleventh N-type transistor has a control terminal coupled to the second input node, a first terminal coupled to a nineteenth node, and a second terminal coupled to the first output node;
- a twelfth N-type transistor, wherein the twelfth N-type transistor has a control terminal coupled to the first input node, a first terminal coupled to the nineteenth node, and a second terminal coupled to the second output node;
- a current sink, drawing a second current from the nineteenth node to a ground voltage;
- a seventh resistor, coupled between the first output node and a twentieth node; and
- an eighth resistor, coupled between the second output node and the twentieth node,
- wherein the first output node and the second output node are arranged for outputting the pair of transmitter output signals.

9. The skew compensation circuit as claimed in claim 4, wherein the common mode comparator further comprises:
- an operational amplifier, wherein the operational amplifier has a positive input terminal coupled to the second node, a negative input terminal, and an output terminal fed back to the negative input terminal.

10. The skew compensation circuit as claimed in claim 5, wherein the common mode detector comprises a first circuit which comprises:
- a first AND gate, wherein the first AND gate has a first input terminal for receiving the first data voltage, a second input terminal for receiving the first comparison voltage, and an output terminal for outputting a first tuning voltage;
- a first inverter, wherein the first inverter has an input terminal for receiving the first tuning voltage, and an output terminal for outputting an inverted first tuning voltage;
- a first switch element, coupled between a supply voltage and a fourth node, wherein the first switch element is closed or opened according to the first tuning voltage;
- a second switch element, coupled between the fourth node and a ground voltage, wherein the second switch element is closed or opened according to the inverted first tuning voltage;
- a first N-type transistor, wherein the first N-type transistor has a control terminal coupled to the fourth node, a first terminal coupled to the ground voltage, and a second terminal coupled to a fifth node;
- a first P-type transistor, wherein the first P-type transistor has a control terminal coupled to the fifth node, a first terminal coupled to the supply voltage, and a second terminal coupled to the fifth node;
- a second P-type transistor, wherein the second P-type transistor has a control terminal coupled to the fifth node, a first terminal coupled to the supply voltage, and a second terminal coupled to a first control node, and wherein the first control node is arranged for outputting the first control voltage; and
- a first capacitor, coupled between the first control node and the ground voltage.

11. The skew compensation circuit as claimed in claim 5, wherein the common mode detector comprises a second circuit which comprises:
- a second AND gate, wherein the second AND gate has a first input terminal for receiving the second data voltage, a second input terminal for receiving the second comparison voltage, and an output terminal for outputting a second tuning voltage;
- a second inverter, wherein the second inverter has an input terminal for receiving the second tuning voltage, and an output terminal for outputting an inverted second tuning voltage;
- a third switch element, coupled between a sixth node and a ground voltage, wherein the third switch element is closed or opened according to the second tuning voltage;
- a fourth switch element, coupled between a supply voltage and the sixth node, wherein the fourth switch element is closed or opened according to the inverted second tuning voltage;
- a third P-type transistor, wherein the third P-type transistor has a control terminal coupled to the sixth node, a first terminal coupled to the supply voltage, and a second terminal coupled to a seventh node;
- a second N-type transistor, wherein the second N-type transistor has a control terminal coupled to the seventh node, a first terminal coupled to the ground voltage, and a second terminal coupled to the seventh node;
- a third N-type transistor, wherein the third N-type transistor has a control terminal coupled to the seventh node, a first terminal coupled to the ground voltage, and a second terminal coupled to a second control node, and wherein the second control node is arranged for outputting the second control voltage; and
- a second capacitor, coupled between the second control node and the ground voltage.

12. The skew compensation circuit as claimed in claim 5, wherein the common mode detector comprises a third circuit which comprises:
- a third AND gate, wherein the third AND gate has a first input terminal for receiving the second data voltage, a second input terminal for receiving the first comparison voltage, and an output terminal for outputting a third tuning voltage;
- a third inverter, wherein the third inverter has an input terminal for receiving the third tuning voltage, and an output terminal for outputting an inverted third tuning voltage;
- a fifth switch element, coupled between a supply voltage and an eighth node, wherein the fifth switch element is closed or opened according to the third tuning voltage;
- a sixth switch element, coupled between the eighth node and a ground voltage, wherein the sixth switch element is closed or opened according to the inverted third tuning voltage;
- a fourth N-type transistor, wherein the fourth N-type transistor has a control terminal coupled to the eighth node, a first terminal coupled to the ground voltage, and a second terminal coupled to a ninth node;

a fourth P-type transistor, wherein the fourth P-type transistor has a control terminal coupled to the ninth node, a first terminal coupled to the supply voltage, and a second terminal coupled to the ninth node;

a fifth P-type transistor, wherein the fifth P-type transistor has a control terminal coupled to the ninth node, a first terminal coupled to the supply voltage, and a second terminal coupled to a third control node, and wherein the third control node is arranged for outputting the third control voltage; and a third capacitor, coupled between the third control node and the ground voltage.

13. The skew compensation circuit as claimed in claim 5, wherein the common mode detector comprises a fourth circuit which comprises:

a fourth AND gate, wherein the fourth AND gate has a first input terminal for receiving the first data voltage, a second input terminal for receiving the second comparison voltage, and an output terminal for outputting a fourth tuning voltage;

a fourth inverter, wherein the fourth inverter has an input terminal for receiving the fourth tuning voltage, and an output terminal for outputting an inverted fourth tuning voltage;

a seventh switch element, coupled between a tenth node and a ground voltage, wherein the seventh switch element is closed or opened according to the fourth tuning voltage;

an eighth switch element, coupled between a supply voltage and the tenth node, wherein the eighth switch element is closed or opened according to the inverted fourth tuning voltage;

a sixth P-type transistor, wherein the sixth P-type transistor has a control terminal coupled to the tenth node, a first terminal coupled to the supply voltage, and a second terminal coupled to an eleventh node;

a fifth N-type transistor, wherein the fifth N-type transistor has a control terminal coupled to the eleventh node, a first terminal coupled to the ground voltage, and a second terminal coupled to the eleventh node;

a sixth N-type transistor, wherein the sixth N-type transistor has a control terminal coupled to the eleventh node, a first terminal coupled to the ground voltage, and a second terminal coupled to a fourth control node, and wherein the fourth control node is arranged for outputting the fourth control voltage; and a fourth capacitor, coupled between the fourth control node and the ground voltage.

* * * * *